(12) United States Patent
Heal et al.

(10) Patent No.: US 6,366,104 B2
(45) Date of Patent: *Apr. 2, 2002

(54) MICROWAVE PROBE FOR SURFACE MOUNT AND HYBRID ASSEMBLIES

(75) Inventors: Mark D. Heal, Redondo Beach; John R. Grebliunas, Manhattan Beach, both of CA (US)

(73) Assignee: Hughes Electronics Corp., El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,542

(22) Filed: Feb. 15, 2000

(51) Int. Cl.[7] .............................................. G01R 31/02
(52) U.S. Cl. ...................................................... 324/754
(58) Field of Search ................................ 324/500, 754, 324/600, 761, 72.5, 149, 601

(56) References Cited

U.S. PATENT DOCUMENTS 6,078,184 A * 6/2000 Heuermann ................. 324/754

* cited by examiner

*Primary Examiner*—Safet Metjahic
*Assistant Examiner*—J Kerveros
(74) *Attorney, Agent, or Firm*—Terje Gudmestad

(57) ABSTRACT

A microwave probe for use with densely populated surface mount and hybrid microwave circuit assemblies includes a housing, a RF signal pin, and ground pins, wherein the pins extend outwardly from the housing. The pins are preferably individually spring-loaded contacts, and are oriented on the housing relative to each other so as to permit contact with a planar transmission line when the pins are perpendicular to the surface of the transmission line or circuit board.

15 Claims, 1 Drawing Sheet

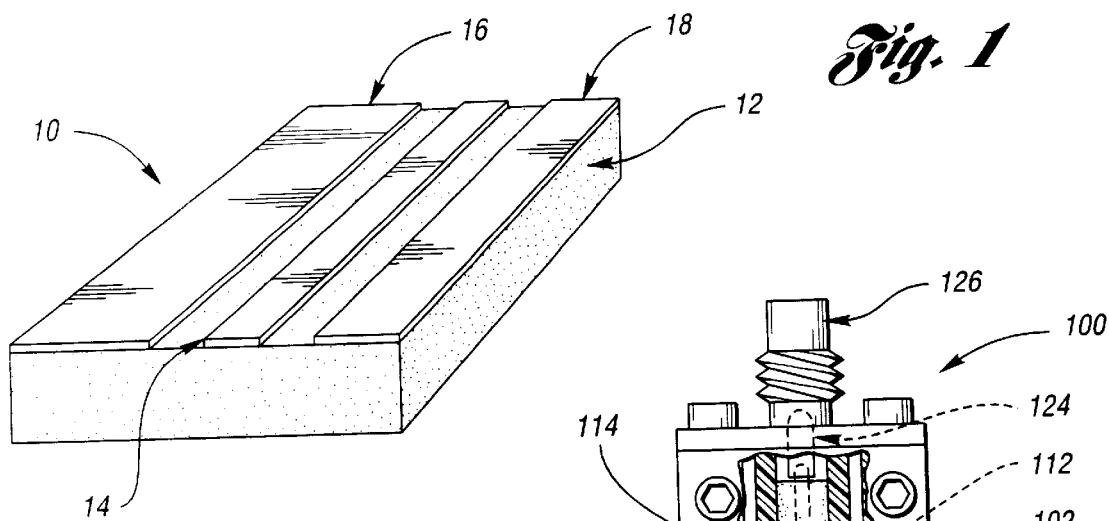
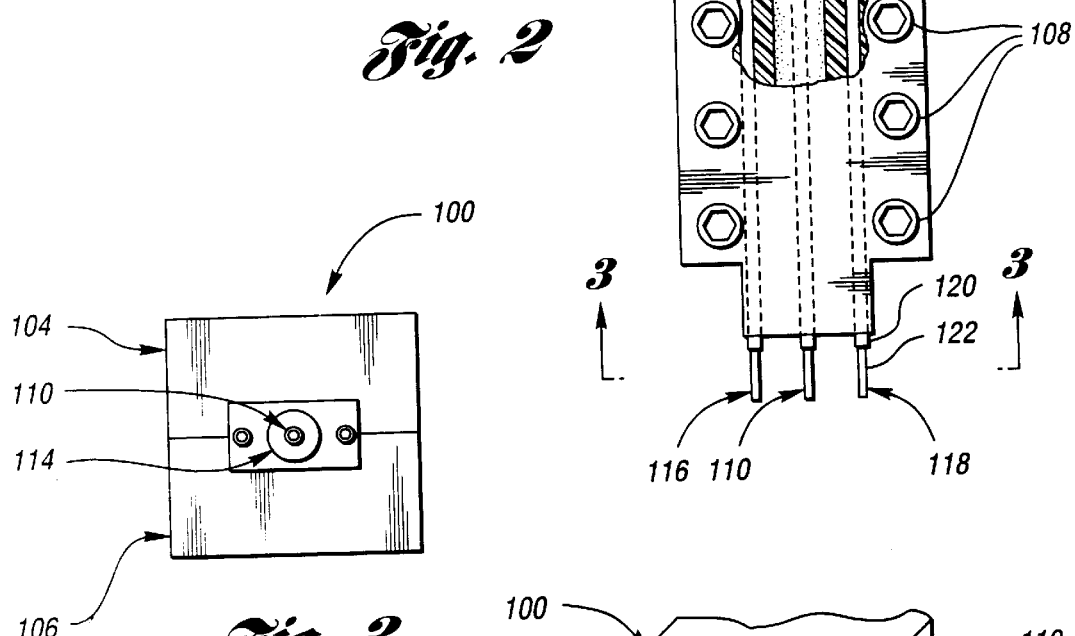
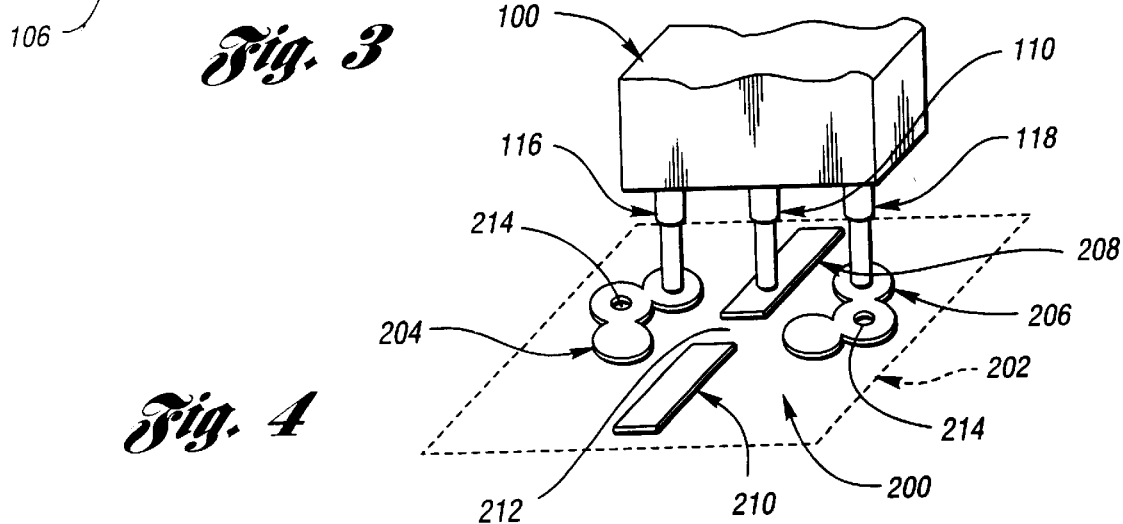

MICROWAVE PROBE FOR SURFACE MOUNT AND HYBRID ASSEMBLIES

TECHNICAL FIELD

The present invention relates to microwave probes suitable for insertion and detection of microwave signals in high frequency circuit assemblies, and more particularly to a microwave probe which can be used with densely populated surface mount and hybrid circuit assemblies.

BACKGROUND ART

Generally, most modern RF microwave circuits and assemblies use planar transmission line structures such as a microstrip or a coplanar waveguide to transmit high frequency signals from one circuit or device to another. Various probe structures have been developed which facilitate "on-wafer" testing and various forms of rapid characterization of high frequency circuits, such as Microwave Integrated Circuits (MIC) and Monolithic Microwave Integrated Circuits (MMIC). One such probe is generally known as an RF wafer probe, which operates as a miniature transmission line structure to permit interfacing with a coaxial transmission line. With such a probe, RF characterization is possible for MMIC devices.

The problem with known wafer probes derives from the fact that the probe design utilizes a planar, blade-like contact element, which requires contact with the microwave circuit at a very low angle relative to the circuit board. Pressure must then be applied to the probe assembly to slightly deflect the probe contact tip to make positive contact with the RF circuit being tested. Such probes were specifically designed to test microwave devices at the flat wafer level, such as the aforementioned MMIC devices. In other words, there are virtually no structures protruding from the surface of the wafer that the probes are required to clear when brought into contact therewith.

However, many RF and microwave assemblies and units are fabricated using either surface mount technologies, or hybrid circuits formed from combinations of surface mount and integrated circuits. These technologies allow the combination of several RF circuits, such as amplifiers, mixers, oscillators, and filters, to be integrated into a planar receiver or synthesizer circuit. The circuits and components in such assemblies are typically located as close as possible to decrease overall size, weight, and cost of the circuit. Because of dense packaging of components on planar circuits, use of conventional wafer probes is either prohibited or restricted due to the requisite low contact angle. In other words, because of the low angle at which known wafer probes contact a circuit board, there are many configurations of surface mount and hybrid circuits where such a probe would not be able to contact the circuit due to the positioning of some nearby component attached to the planar circuit, or due to the type of package in which the circuit has been placed.

In addition, known wafer probes also have very limited ability to make simultaneous contact with surfaces of different heights. More specifically, most common microwave applications call for a coplanar or "ground-signal-ground" type probe, which is used to contact a type of transmission line known as a coplanar waveguide. As shown in FIG. 1, a coplanar waveguide 10 is formed from a substrate 12 having a plurality of metal strips formed on the surface thereof. A center strip 14 provides a signal line, while side strips 16 and 18 are located on both sides of the center strip and separated by uniform gaps. Metal strips 16 and 18 connect to a ground potential of the RF system. Electromagnetic fields are supported between the center conducting strip and the strips which form the ground. Known coplanar waveguide wafer probes are limited in their ability to bridge nonuniform trace heights between the signal and ground strips.

DISCLOSURE OF THE INVENTION

Therefore it is an object of the present invention to provide an improved microwave probe which can be used with surface mount, and hybrid microwave circuit assemblies.

It is another object of the present invention to provide a microwave probe which can be used with microwave circuit assemblies having probe contact points of non-uniform surface height.

In accordance with these and other objects, a probe is provided for making temporary connections to a planar transmission line integrated onto a circuit board, wherein the probe includes a probe housing, a signal pin having a first end extending outwardly from the probe housing, and at least one ground pin also having a first end extending outwardly from the probe housing. The signal pin and the at least one ground pin are affixed to the probe housing with an orientation relative to each other to permit contact with the planar transmission line when the signal pin and the ground pin(s) are substantially perpendicular to the transmission line.

In accordance with one aspect of the present invention, each pin on the probe is individually spring-loaded to allow simultaneous contact of the probe with a transmission line or circuit board having a non-uniform surface height.

Thus, the probe of the present invention allows contact with a wide variety of planar transmission line circuits so that the probe pins are substantially perpendicular to the surface of the circuits. As a result, minimal surface area clearance is required, thereby permitting use of the probe in close proximity to any nearby component, circuit, or circuit package. Therefore, the present invention overcomes the difficulties of known wafer probes and allows individual circuit functions to be characterized or tested in situ on surface mount or hybrid circuit assemblies. This, in turn, allows test access to surface mount and hybrid circuit assemblies without concern of packaging density.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 shows a perspective view of a circuit substrate having a coplanar transmission line integrated thereon;

FIG. 2 shows a side view of a probe in accordance with the present invention;

FIG. 3 shows a view of the probe of FIG. 2 take along line 3—3; and

FIG. 4 shows the probe in contact with a microwave circuit board in accordance with the present invention.

BEST MODE FOR CARRYING OUT THE INVENTION

Referring to FIGS. 2 and 3, a microwave probe 100 in accordance with the present invention includes a housing 102 formed by mating together two half-shells 104 and 106.

Half-shells 104 and 106 are held together upon assembly by a plurality of fasteners 108.

A set of contact pins extend outwardly from one end of housing 102 so as to be able to be brought into contact with the surface of a printed circuit board. More specifically, the set of contact pins are arranged so that one pin will function as a radio frequency (RF) signal pin, and at least one pin will function as a ground pin for connecting to a ground potential on the circuit board.

As shown in FIGS. 2 and 3, a preferred embodiment of the present invention is particularly designed to be used with surface mounted or hybrid circuit microwave assemblies having a coplanar waveguide transmission line, like that shown in FIG. 1, integrated thereon. Thus, a middle pin 110 functions as the RF signal pin, and is formed from a conductor of a coaxial transmission line 112 extending through housing 102. A dielectric sleeve 114 forms an insulator for the coaxial line and provides structural support for affixing pin 110 to housing 102. While it is not to be construed as limiting, dielectric sleeve 114 is formed from a material such as Rexolite, and creates a 50 ohm characteristic impedance for the coaxial transmission line. In further accordance with the preferred embodiment of the present invention, the at least one ground pin is implemented as a pair of ground pins 116 and 118 respectively positioned on opposite sides of center pin 110, and are each affixed to housing 102 such as by soldering.

In further accordance with the present invention, each pin is formed from a spring-loaded contact having a stationary outer casing 120 supported by housing 102 for ground pins 116 and 118, and the dielectric sleeve 114 for signal pin 110. Inner portion 122 of each pin is slidably movable relative to outer casing 120, and is normally biased outwardly away from housing 102 and outer casings 120, as is well understood to one having ordinary skill in the art. In the preferred embodiment, inner portion 122 is capable of moving at least one tenth of an inch relative to outer casing 120.

In addition, an SMA-type pin adapter 124 is soldered to the end of signal pin 110 for mating with a field replaceable SMA connector 126. SMA connector 126 facilitates easy connection of probe 100 with suitable testing equipment.

FIG. 4 illustrates use of the preferred embodiment for allowing temporary connection to be made with a conventional coplanar waveguide to microstrip transmission line transition 200 integrally formed on a circuit board 202. Transition 200 is typically formed from a pair of coplanar waveguide contacts 204 and 206, and a pair of microstrip transmission lines 208 and 210 spaced by a gap 212, and arranged to extend between contacts 204 and 206. Each coplanar waveguide contact is provided with a hole 214 to facilitate connection to a ground potential on circuit board 202.

In operation, as seen in FIG. 4, pins 110, 116 and 118 of probe 100 are brought into simultaneous contact with transition 200 while the pins are substantially perpendicular to circuit board 202. In order to ensure a quality contact has been made, downward pressure is applied to compress the pins. RF signals are then picked-up and passed through probe 100 to SMA connector 126 via coaxial transmission line 112. Thus, since probe 100 is substantially perpendicular to the transmission line and circuit board, contact with the board can be made without disturbing or contacting any surrounding circuit components.

As a result, the probe of the present invention is ideally suited for use with densely populated surface mounted and hybrid microwave circuits, which, in turn, allows a significant reduction in time and expense for testing such circuits during manufacture. More specifically, in the past, conventional testing of surface mount and hybrid assemblies has required individual components thereof to be tested prior to unit assembly. In accordance with conventional methods, testing of these individual components was accomplished either by placement in a special test fixture, or testing at the wafer level. Then, after complete assembly, the entire unit would be tested via RF connectors coupled to the unit input(s) and/or output(s).

However, because the present invention allows testing of individual circuit components and subassemblies after placement on the circuit board, the need for individual component test fixtures and the time associated with the use of such fixtures is obviated.

In addition, the use of individual spring-loaded pins further facilitates testing of surface mount circuits because the ability of each pin to make simultaneous contact with surfaces of different heights relative to the circuit board allows the present invention to accommodate differences in trace heights. This feature is particularly advantageous with surface-mounted circuits because build-up of solder on circuit traces can cause several thousandths of an inch difference in trace height.

While the best mode for carrying out the invention has been described in detail, those familiar with the art to which this invention relates will recognize various alternative designs and embodiments for practicing the invention as defined by the following claims.

What is claimed is:

1. A microwave probe for making connections to a planar transmission line integrated onto a circuit board, said probe comprising:
    a housing;
    a vertically spring-loaded radio frequency signal pin having a first end protruding outwardly from said housing; and
    at least one vertically spring-loaded ground pin having a first end protruding outwardly from said housing, wherein said signal pin and said ground pin are individually spring-loaded and affixed to said housing having an orientation relative to each other to permit contact with the planar transmission line when said signal pin and said ground pin are perpendicular to the transmission line.

2. The probe of claim 1 further comprising a coaxial transmission line formed from a dielectric sleeve encapsulating said RF signal pin within said housing.

3. The probe of claim 2 further comprising a field connector mounted to said housing and coupled to said coaxial transmission line at an end opposite the first end of said RF signal pin.

4. The probe of claim 1 wherein said ground pin is attached to said housing at an end opposite the first end.

5. The probe of claim 1 wherein said ground pin comprises two separate ground pins.

6. The probe of claim 5 wherein the pin orientation permits contact with a coplanar waveguide to microstrip transmission line transition integrated onto the circuit board.

7. A method for testing a microwave circuit having at least a plurality of surface mounted circuit components and a planar transmission line integrated onto a circuit board, said method comprising the steps of:
    connecting an output jack of a microwave probe to a signal analyzer, said probe comprising a vertically spring-loaded radio frequency signal pin having a first end protruding outwardly from a probe housing, and at least one vertically spring-loaded ground pin also having a first end protruding outwardly from the housing said signal pin and said ground pin being individually spring-loaded;

orienting the probe so that the signal pin and the ground pin are perpendicular to the planar transmission line; and bringing the signal pin and the ground pin into contact with the planar transmission line while the pins are still perpendicular to the planar transmission line.

8. The method of claim 7 further comprising the step of exerting a force on the probe housing after the pins come into contact with the planar transmission line so as to compress the pins in a vertical direction.

9. The method of claim 7 wherein the probe comprises two ground pins, and the planar transmission line comprises a coplanar waveguide to microstrip transmission line transition integrated onto the circuit board, said method further comprising the step of bringing the probe pins into contact with the transmission line transition so that the signal pin makes a perpendicular contact with the microstrip transmission line while each ground pin makes a perpendicular contact with a respective one of a pair of coplanar waveguide contacts.

10. A microwave probe for making connections to a planar transmission line integrated onto a circuit board, said probe comprising:

a housing formed from two mating half-shells fastened together, said housing including an output jack mounted thereon;

a vertically spring-loaded radio frequency signal pin having a first end protruding outwardly from said housing and said signal pin being connected to said output jack; and at least one vertically spring-loaded pin grounded to said housing, said ground pin having a first end protruding outwardly from said housing, wherein said signal pin and said ground pin are individually spring-loaded and positioned on said housing having an orientation relative to each other to permit contact with the planar transmission line when said signal pin and said ground pin are perpendicular to the transmission line.

11. The probe of claim 10 further comprising a coaxial transmission line formed from a dielectric sleeve encapsulating said RF signal pin between the two half-shells of said housing.

12. The probe of claim 11 wherein said output jack comprises a field connector mounted to said housing and coupled to said coaxial transmission line at an end opposite the first end of said RF signal pin.

13. The probe of claim 10 wherein said ground pin is attached to said housing at an end opposite the first end.

14. The probe of claim 10 wherein said ground pin comprises two separate ground pins.

15. The probe of claim 14 wherein the pin orientation permits contact with a coplanar waveguide to microstrip transmission line transition integrated onto the circuit board.

* * * * *